United States Patent
Mihail

(10) Patent No.: US 10,082,345 B1
(45) Date of Patent: Sep. 25, 2018

(54) FIN PACK COOLING ASSEMBLY

(71) Applicant: DOMETIC SWEDEN AB, Solna (SE)

(72) Inventor: Adrian Mihail, Westfield, IN (US)

(73) Assignee: Dometic Sweden AB, Solna (SE)

( * ) Notice: Subject to any disclaimer, the term of this patent is extended or adjusted under 35 U.S.C. 154(b) by 200 days.

(21) Appl. No.: 14/826,496

(22) Filed: Aug. 14, 2015

Related U.S. Application Data

(60) Provisional application No. 62/037,925, filed on Aug. 15, 2014.

(51) Int. Cl.
| | | |
|---|---|---|
| *F28F 7/00* | (2006.01) | |
| *F28F 3/12* | (2006.01) | |
| *F28F 3/02* | (2006.01) | |
| *F25D 3/00* | (2006.01) | |
| *F28F 9/00* | (2006.01) | |
| *H01L 23/467* | (2006.01) | |
| *F25D 23/06* | (2006.01) | |

(52) U.S. Cl.
CPC ............... *F28F 3/12* (2013.01); *F25D 3/005* (2013.01); *F25D 23/061* (2013.01); *F28F 3/02* (2013.01); *F28F 9/002* (2013.01); *H01L 23/467* (2013.01)

(58) Field of Classification Search
CPC ... H01L 23/467; F28F 3/12; F28F 3/14; F28F 9/001; F28F 9/002; F25D 13/00; F25D 17/062; F25D 23/066; F25D 23/061
USPC ....................................................... 165/80.3
See application file for complete search history.

(56) References Cited

U.S. PATENT DOCUMENTS

| | | | |
|---|---|---|---|
| 5,335,722 A | 8/1994 | Wu | |
| 5,375,655 A | 12/1994 | Lee | |
| 5,594,623 A | 1/1997 | Schwegler | |
| 5,771,153 A * | 6/1998 | Sheng | ............... H01L 23/4093 |
| | | | 165/185 |
| 5,819,407 A | 10/1998 | Terada | |
| 5,835,347 A * | 11/1998 | Chu | ..................... H01L 23/467 |
| | | | 165/122 |
| 5,864,464 A | 1/1999 | Lin | |
| 6,137,680 A | 10/2000 | Kodaira et al. | |
| 6,176,304 B1 | 1/2001 | Lee et al. | |
| 6,269,864 B1 | 8/2001 | Kabadi | |
| 6,328,529 B1 | 12/2001 | Yamaguchi et al. | |
| 6,407,920 B1 | 6/2002 | Jui-Yuan et al. | |

(Continued)

FOREIGN PATENT DOCUMENTS

EP  0883179  12/1998

OTHER PUBLICATIONS

Amphenol TCS; Amphenol and Avago Jointly Develop New Micro LGA Integrated Socket Solution for 40G/100G Ethernet/OTN Applications; Amphenol Website; http://www.amphenol-tcs.com; pp. 1-2; dated Jan. 2, 2014.

*Primary Examiner* — Hung Q Nguyen
*Assistant Examiner* — Mark L Greene
(74) *Attorney, Agent, or Firm* — Middleton Reutlinger

(57) ABSTRACT

An extruded fin pack assembly is provided which is positioned within an appliance cabinet. In the embodiments, the fin pack includes a plurality of fins which are mounted in a substantially vertical plane and create flowpaths for air flow currents therethrough. A cover is provided to attach to the fins and hide the fins from view when the cabinet of the refrigerator or freezer is open. The cover also increases efficiency of the flowpaths between the fins thereby increasing convection heat transfer and increasing removal of heat from within the cabinet.

16 Claims, 8 Drawing Sheets

(56) References Cited

U.S. PATENT DOCUMENTS

| | | | |
|---|---|---|---|
| 6,545,872 B1 | 4/2003 | Lonergan et al. | |
| 6,760,221 B2 | 7/2004 | Goth et al. | |
| 7,289,322 B2 | 10/2007 | Chen et al. | |
| 7,661,462 B2 | 2/2010 | Kuo | |
| 7,967,059 B2 | 6/2011 | Lin et al. | |
| 8,238,102 B2 | 8/2012 | Wei et al. | |
| 8,537,536 B1* | 9/2013 | Rembach | H05K 7/1497 361/679.47 |
| 2005/0091993 A1* | 5/2005 | Paradis | F24F 3/1405 62/93 |
| 2005/0115263 A1* | 6/2005 | Hallin | F25D 17/06 62/276 |
| 2009/0145580 A1 | 6/2009 | Lin et al. | |
| 2011/0079370 A1* | 4/2011 | Wen | F28F 13/00 165/80.3 |
| 2013/0044426 A1* | 2/2013 | Neumann | G06F 1/20 361/679.54 |

\* cited by examiner

FIN PACK COOLING ASSEMBLY

CLAIM TO PRIORITY

This Non-Provisional utility application claims priority to and benefit from under 35 U.S.C. § 119(e) currently provisional application having U.S. Patent Application Ser. No. 62/037,925, titled "Fin Pack Cooling Assembly" and having filing date Aug. 15, 2014, all of which is incorporated by reference herein.

BACKGROUND

Field of the Invention

Present embodiments generally relate to a cooling assembly for use within a cabinet of an appliance. More specifically, present embodiments are related to, without limitation, an extrusion fin pack assembly which improves cooling characteristics within a cabinet of an appliance.

Description of the Related Art

In the use of refrigerators and freezers, it is generally desirable to increase the efficiency of thermal transfer within the cabinet to improve efficiency of cooling of an appliance. Additionally, it is desirable to maintain the aesthetically pleasing look of the interior of the appliance cabinet by inhibiting clutter of the interior with mechanisms and structures which either may be damaged by the stored products therein or alternatively, do not interfere with the clean look of the interior of the appliance.

Accordingly, there is a need to overcome these and other deficiencies while meeting the desired goals of increasing thermal transfer efficiencies and maintaining the aesthetically pleasing interior space for the cabinet.

The information included in this Background section of the specification, including any references cited herein and any description or discussion thereof, is included for technical reference purposes only and is not to be regarded subject matter by which the scope of the invention is to be bound.

SUMMARY

An extruded fin pack assembly is provided which is positioned within an appliance cabinet. In the embodiments, the fin pack includes a plurality of fins which are mounted in a substantially vertical plane and create flowpaths for air flow therethrough. The airflow moves in the axial direction of the fins, or parallel to the length of the fins. A cover is provided to attach to the fins and hide the fins from view when the cabinet of appliance is open. The cover also increases efficiency of the flowpaths between the fins thereby increasing convection heat transfer and increasing removal of heat from within the cabinet.

According to some embodiments, a cooling structure for an appliance cabinet, comprises an extruded fin pack including a base and a plurality of fins extending from the base, a head located at an end of the fins opposite the base, each head having at least one retaining edge. The cover may have a first end, a second end and third and fourth edges therebetween. The cover may have a substantially planar cover wall and a grasp located along the third and fourth edges. The grasp may engage a retaining edge of the head of the fins to retain the cover on the fin pack. The grasp may have a dimension which is half or less than half of a spacing between adjacent fins of the plurality of fins.

Optionally, the plurality of fins may each have a plurality of segments. The cover may create a plurality of flowpaths between the base, the fins and the cover. Each of the heads may have a first retaining edge and a second retaining edge. The cover hiding the fins from view within the cabinet. The fins arranged to create vertical flowpaths within the refrigerator cabinet. The third and fourth edges extending substantially vertically. The cover having sidewalls. The grasp may extend from the cover wall. The cover may be open along the first end and the second end to allow air flow through the fins. The third and fourth edges may be free of blockage and improving flow of air through the flowpaths and between the cover. The cooling structure may further comprising a second cover connected to the fin pack adjacent to the first cover.

According to another embodiment, a cooling assembly for an appliance comprises a cabinet having at least one opening for storage of fresh or frozen food products, an extruded fin pack in thermal communication with a heat exchanger used to remove heat from the cabinet. The fin pack includes a base and a plurality of fins extending from the base, the fins defining a plurality of planar flowpaths extending substantially vertically. The fins at ends of the fin pack may each have a head. A cover may have a planar surface and at least one grasp along opposed edges of the cover. The cover may be disposed on the plurality of fins at ends of the fins opposite the base. The at least one grasp may engage the heads to retain the cover in a vertical plane, so that the assembly creates an improved flow through the flowpaths and under the cover for improved cooling of the cabinet.

Optionally, the heads may have at least one retaining edge to engage the grasp. The grasp may be sized so that two adjacent grasps may be positioned between adjacent fins. The cover may include a sidewall, the grasp located at an edge of the sidewall. The upper and lower ends of the cover may be open for flow of cooling air between the fins.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. All of the above outlined features are to be understood as exemplary only and many more features and objectives of a fin pack cooling assembly may be gleaned from the disclosure herein. Therefore, no limiting interpretation of this summary is to be understood without further reading of the entire specification, claims and drawings, included herewith.

BRIEF DESCRIPTION OF THE DRAWINGS

In order that the embodiments may be better understood, embodiments of the fin pack cooling assembly will now be described by way of examples. These embodiments are not to limit the scope of the claims as other embodiments of the fin pack cooling assembly will become apparent to one having ordinary skill in the art upon reading the instant description. Non-limiting examples of the present embodiments are shown in figures wherein:

DETAILED DESCRIPTION

Figure 1:
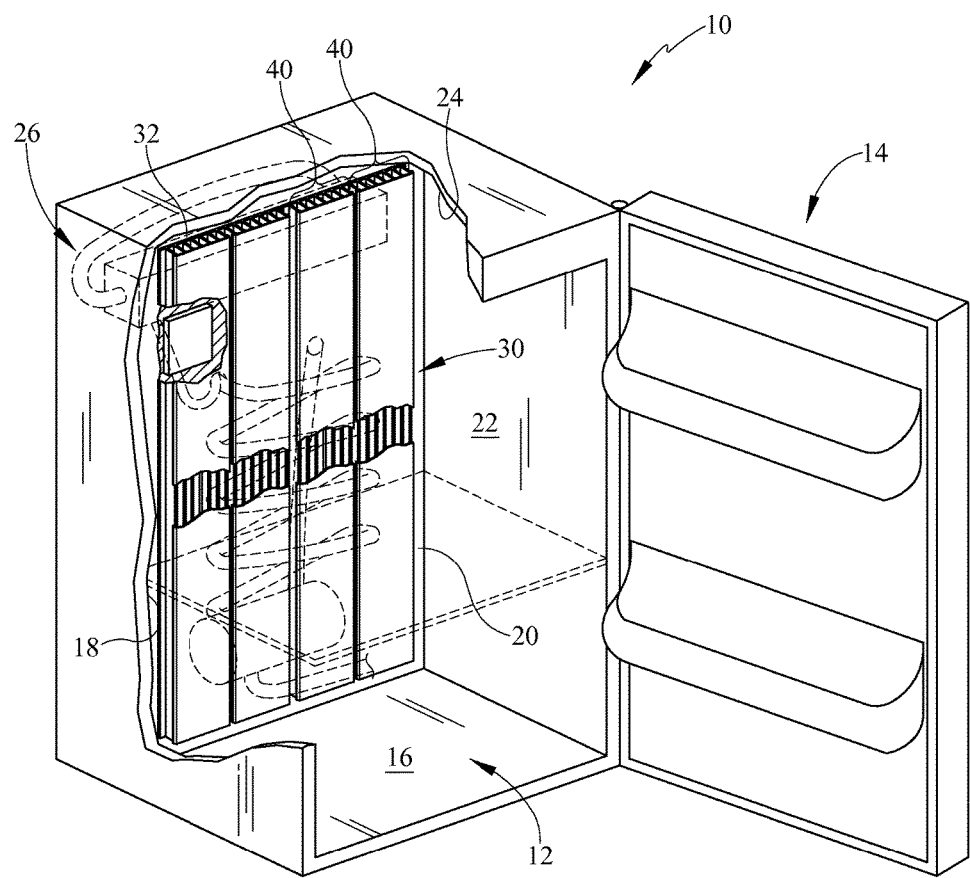
FIG. 1 is a front perspective view of an open appliance with the fin pack cooling assembly located in the rear wall of a cabinet.

It is to be understood that the fin pack cooling assembly is not limited in its application to the details of construction and the arrangement of components set forth in the following description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Referring now in detail to the drawings, wherein like numerals indicate like elements throughout the several views, there are shown in FIGS. 1-8 various embodiments of a fin pack cooling assembly. The fin pack cooling assembly is located in a vertical wall of a cabinet of an appliance such as a refrigerator or freezer and provides improved convection flow and heat transfer within the cabinet for improved cooling efficiency. The structure provides a fin pack which is in thermal communication with a heat exchanger which is utilized with the appliance, for non-limiting example an evaporator. The fin pack includes a plurality of fins extending in a vertical plane, or at least partially vertically oriented, for example at an angle having a vertical component, and heads located at ends of the fins. The fin pack further includes a cover mounted to the heads to hide the fins and improve flow of cooling fluid, such as air, within the cabinet between the fins in a vertical direction. The result is an assembly which improves the thermal transfer efficiency within the cabinet of the appliance.

Referring now to FIG. 1, a front view of a refrigerator appliance 10 is depicted. The appliance 10 depicted is shown as a vertically standing device however, alternate designs may include horizontally oriented refrigerators or freezers. Additionally, the appliance 10 may be a singular appliance such as a freezer or refrigerator, or may be a combination refrigerator and freezer and does not necessarily need to be a singular appliance as depicted. For example, the freezer may be separated from the refrigerator and include a second door or alternatively, the freezer may be located within the refrigerator and within a partitioned area designated for frozen goods, such as a small freezer enclosure within the refrigerator cabinet. The appliance 10 includes a cabinet 12, at least one door 14, which is shown in an open position revealing the interior cabinet. The cabinet 12 includes a floor 16, walls 18, 20, 22 and a ceiling 24. As mentioned, the cabinet 12 may be formed into two appliances or partitioned as shown by the broken line partitioning structure wherein the cabinet 12 has a freezer area and a separate refrigeration area. Alternatively, the cabinet 12 may be formed in a single partition as shown. The refrigerator includes a heat exchange system 26 which is located, according the instant embodiment, on the rear of the refrigerator/freezer appliance 10. The heat exchange system 26 is shown generally in broken line and represents any of various types of refrigeration systems. For example, the system 26 may be a cyclic refrigeration system such as vapor cycle compression or vapor absorption or gas cycle. Additionally, the heat exchange system 26 may be a thermoelectric refrigeration system. According to the exemplary embodiment, the depicted system 26 is a vapor absorption system and a fin pack assembly may be in thermal communication with an evaporator. For purpose of clarity, the remaining description will be related to a single enclosure cabinet 12, such as a refrigerator. However, according to alternate embodiments, the fin pack cooling assembly may alternatively be used with other structures such as room cooling, for example electrical plant rooms with excessive heat and which must be cooled.

The embodiment depicts at least one fin pack cooling assembly 30 located on the rear wall 20 of the appliance cabinet 12 however, this should not be considered limiting as the structure may be positioned on any of the vertical walls of the appliance cabinet 12, including the side walls 18, 22 and/or rear wall 20. Additionally, it should be understood that while multiple fin pack cooling assemblies 30 are shown in the depicted embodiment, a single fin pack cooling assembly 30 may be utilized along the rear wall 20 or side walls 18, 22 or in combination to improve thermal transfer. The number of fin pack cooling assemblies 30 will depend in part upon the amount of cooling desired and size of the cabinet 12. Four fin pack cooling assemblies 30 are shown on the rear wall 20 extending substantially vertical. The assemblies 30 are in thermal communication with the system 26, to transfer heat from the cabinet interior to the fin pack assemblies 30 and the heat exchanger system 26. The assemblies 30 each comprise a base 32, a plurality of fins 40 extending from the base and a cover opposite the base. The assemblies 30 may have a height which extends the entire distance of the wall 20, or multiple assemblies may be used to cover the rear wall 20 in a vertical direction. Additionally, the assemblies 30 may have a width equal to the width of the cabinet or may be less than the cabinet width so that multiple assemblies may be utilized as shown.

Figure 2:
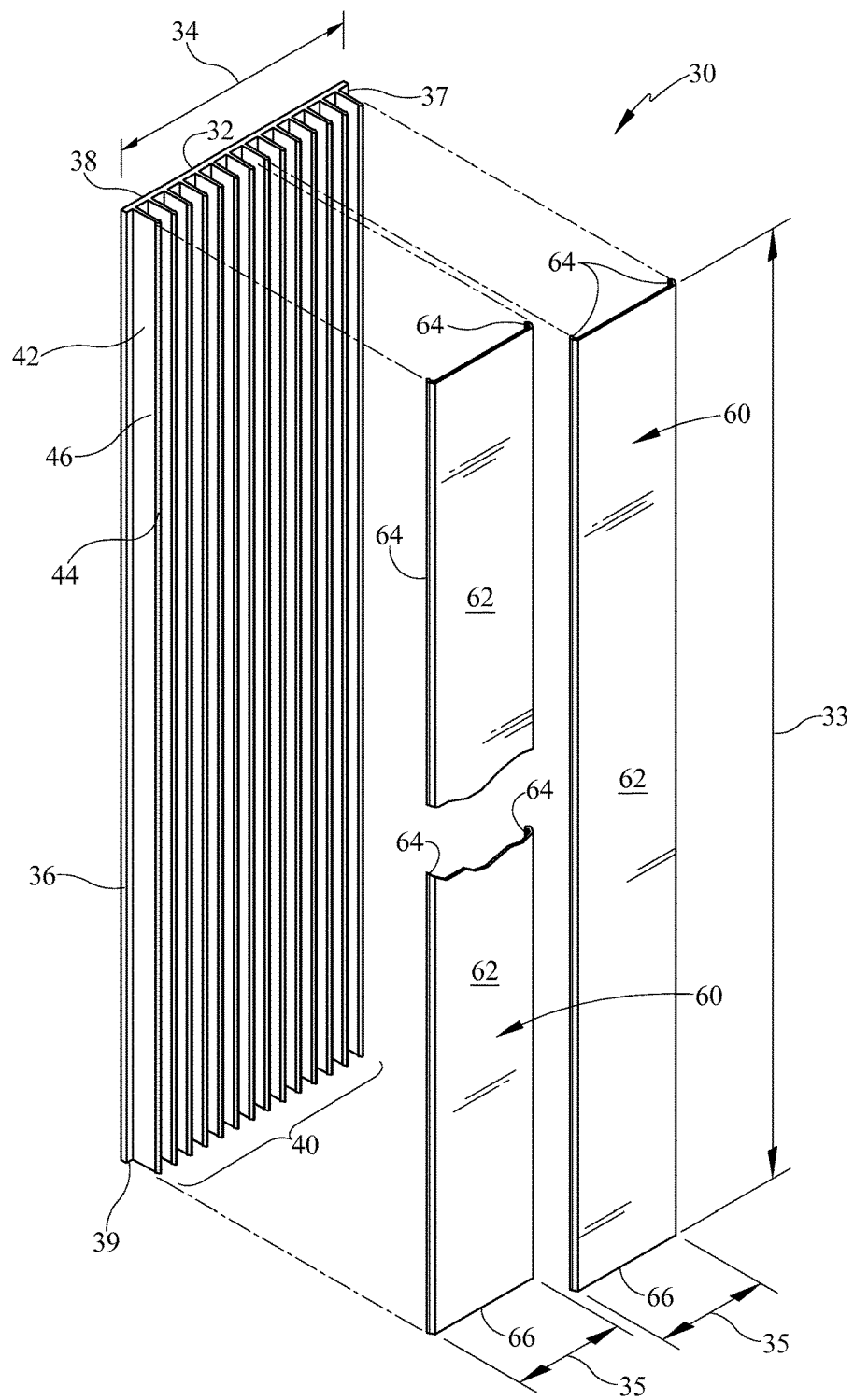
FIG. 2 is an exploded perspective view of the fin pack cooling assembly removed from the cabinet of FIG. 1.

Referring now to FIG. 2, an exploded perspective view of one fin pack cooling assembly 30 is depicted. The assembly 30 is removed from the cabinet 12 for ease of viewing the various parts. However, one skilled in the art will understand that the fin pack cooling assembly 30 is in thermal communication with the heat exchanger system 26 which is shown at the rear of the cabinet 12 (FIG. 1).

The assembly 30 includes a fin pack including a base 32 and a plurality of fins 40. The base 32 and fins 40 are formed of a thermally conductive material. For example, various materials may be utilized, and according to some embodiments, may allow for extrusion. Among others, aluminum, copper and silver may be utilized due to the thermally conductive characteristics of the materials. A temperature differential exists between the exterior of the appliance 10 and the interior. The base 32 and fins 40 provide a conduit for thermal energy between the cabinet interior, and the exterior of the appliance 10. For example, the heat exchanger 26 is cold and is in thermal communication with the base 32. The base 32 is also in thermal communication with the fins 40 which are within the cabinet 12 of appliance 10. Heat within the cabinet 12 is drawn to the fins 40 and moves through the plate 32 to the heat exchanger 26. A cover 60 improves air flow around the fins by created flowpaths which direct convective currents moving about the fins 40. Any higher thermal energy within the cabinet 12 is drawn to the fins and therefore removed from the cabinet. By moving air between the fins 40, the transfer of thermal energy is improved. According to some embodiments, the base 32 and fins 40 may be extruded from a single piece of material. This provides for ease of manufacturing and improved strength and heat transfer. The assembly 30 further comprises a cover 60 which is connected to the fins 40 and covers the fins 40 to provide an aesthetically pleasing structure for hiding the fins from view when the appliance 10 is opened. The cover 60 may be formed of various materials which may or may not be thermally conductive. Additionally, the base 32 may be of a length 34 which corresponds to the length of a single cover 60. In the depicted embodiments, the length 34 is equal to the width of two covers 60. Alternatively, one or more covers 60 may be used to cover a base and fins in a vertical direction. As a further embodiment, two or more bases 32 may be equal to the vertical length of one or more covers 60.

The fin pack cooling assembly 30 includes a base 32 which is planar and provides a conduit between the heat exchanger assembly 26 of the refrigerator and the fins 40 of the assembly 30. The base 32 may be formed of various shapes and according to the instant embodiment, is rectangular having two vertical parallel edges 36, 37 and two horizontal parallel edges 38, 39 which define the planar shape of the base 32. The base 32 is arranged in the cabinet 12 of the appliance 10 in a vertical orientation along one or more of the walls 18, 20, 22. With reference again to FIG. 1, the base 32 may be adhered to the rear wall 20 by a thermal adhesive, welding, fastening or other means. Alternatively, the base 32 may extend through a hole in rear wall 20 so that the base 32 is in contact with the heat exchanger 26 and the base 32 is flush with the rear wall 20.

Extending between the top edge 38 and the bottom edge 39 of the base 32 are the fins 40. The fins 40 have an axial dimension extending between top and bottom edges 38, 38. Further, the fins 40 extend from the surface of base 32. The fins 40 extend outwardly from the plane of the base 32 in a perpendicular direction to the axial or longitudinal dimension. According to some embodiments, the fins 40 may be arranged at an angle to the vertical direction. Each of the fins 40 include a wall 42 and a head 44 at an end 46 of the fin opposite from the base 32. The wall 42 is shown extending linearly but alternatively, may be formed of a plurality of linear segments or may be curvilinear. The head 44 is formed with a shape which corresponds to grasps 64 located which are located at lateral edges of the cover 60.

In the depicted embodiments, the two covers 60 are shown. The covers 60 may have a vertical, longitudinal dimension 33 which is equal to the vertical dimension of the base 32 or may be some fractional length, or may be a multiple of a length of the base 32 vertical dimension. The cover 60 may have a width dimension 35, the covers 60 may be equal to base width or length 34 or may be a fractional length of the length 34 or, alternatively the base length 34 may be equal to a multiple of the length 34. In the instant embodiment, the width 35 of each cover 60 is about one-half (½) that of base 32. Further, the height 33 is substantially equal to that of the base 32. However, the height of the cover 60 may be some fraction of the height of the base 32. The cover 60 includes a cover wall 62 which is substantially planar. The lateral ends of the cover wall 62 include grasps 64 which grab and retain the cover 60 against the fins 40.

Figure 3:
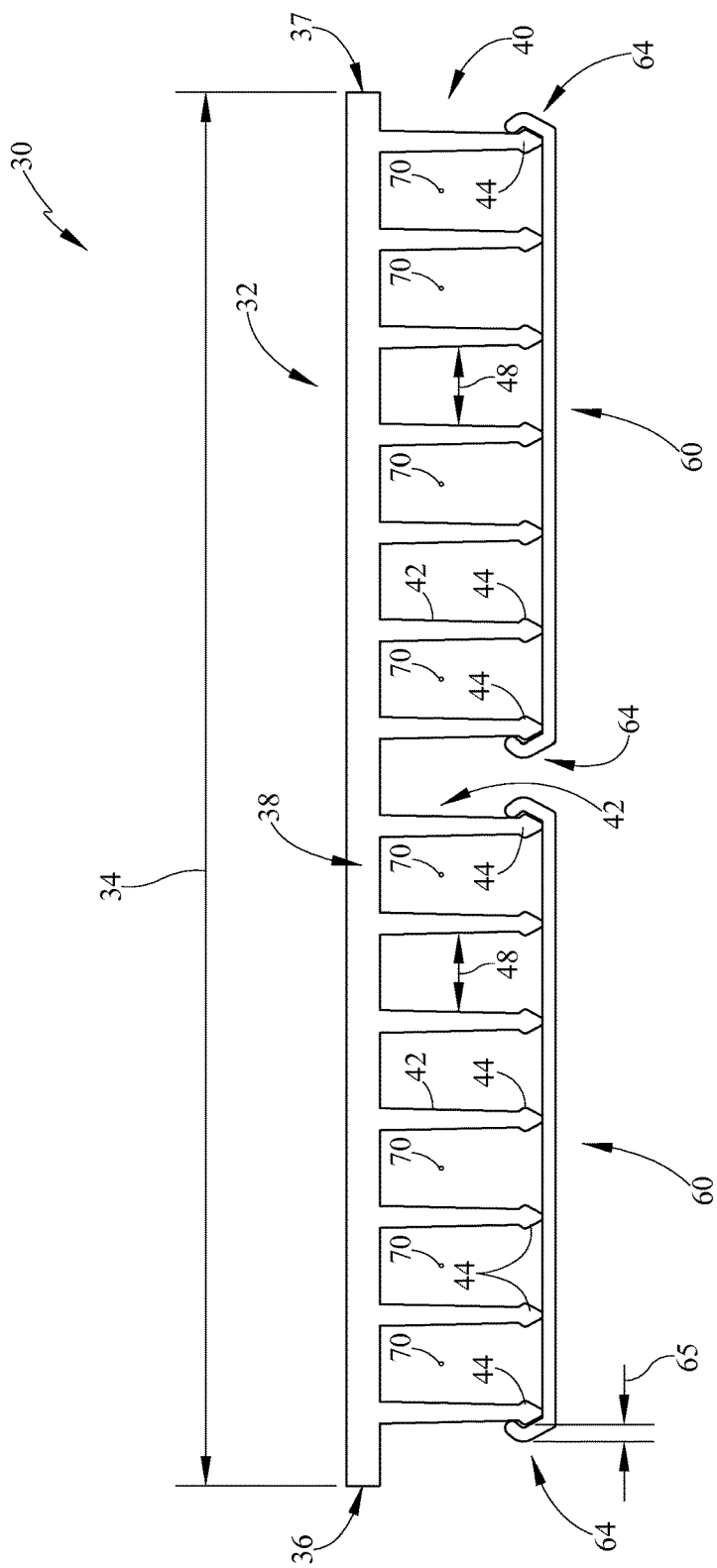
FIG. 3 is an assembled upper view of the fin pack cooling assembly.

Referring now to FIG. 3, an assembled upper view of the fin pack cooling assembly 30 is depicted. In this view, the covers 60 are positioned on the fins 40 by connecting the grasps 64 to at least one head 44. In the depicted embodiment, the fins 40 each comprise a head 44 at an end of the fin wall 42. The grasps 64 may be hook-like features which at least partially correspond in shape to the head 44 so that the grasps 64 retain the cover 60 on the fins 40. In this way, the fins 40 are hidden from view as shown in FIG. 1 when a user opens the appliance door 14 and views the interior of the appliance.

The fin walls 42 extend linearly from the base 32 and may be linear, formed of linear segments, curvilinear or some combination thereof. In the instant embodiment, the fin walls 42 are continuous from upper edge 38 to lower edge 39. However, the fin walls 42 may have breaks or gaps located between fin ends. The fin walls 42 may extend outwardly from the base 32 with a substantially constant width or may be tapered from the base 32 to the head 44, or some partial distance therebetween.

In the instant embodiment, a head 44 is located on each fin 40. However, according to some other embodiments, the fins 40 may be free of heads 44 except for pre-selected locations dependent upon the lateral length between grasps 64 of the cover 60. Accordingly, only fins 40 at ends of the assembly may require heads 44. This may be dependent upon how the extruder tool is formed to make the fin pack assembly 30 or alternatively, may depend on the width of the cover 60.

Additionally, as shown in this view, the fins 40 are spaced apart a distance 48. The distance 48 is equal to or greater than the lateral dimension 65 of the grasp 64 so that two adjacent covers 60 may be positioned along a single fin pack cooling assembly 30. Specifically, the two grasps 64 should fit within a single spacing 48 of adjacent fins 40 so that the covers 60 may fit adjacent to one another and between any adjacent pair of fins 40. This is best shown at the central location of the base 32, where two cover grasps are disposed in a spacing 48. As shown in the embodiment, two covers 60 are positioned over the width 34 of base 32. However, one cover 60 may be used or more than two covers 60 may be used.

Additionally, the spaces between fins 40 define flowpaths 70 wherein air within the cabinet 12 moves into or out of the page in the depicted embodiment. The base 32 defines one boundary, the cover 60 defines an opposite boundary and adjacent fins 40 define side lateral boundaries to enclose the flowpaths 70. It was believed that in an effort to improve aesthetics, enclosing the fin pack might limit heat transfer and reduce cooling. However, unexpectedly, the heat transfer improved due to the flowpaths 70 directing movement of air over the fins 40 more efficiently. According to some examples, the temperature difference with the fin pack cooling assembly 30 decreased temperature within the cabinet 12 by as much as 3 degrees, due at least in part to more efficient direction of the convective currents therein.

Figure 4:
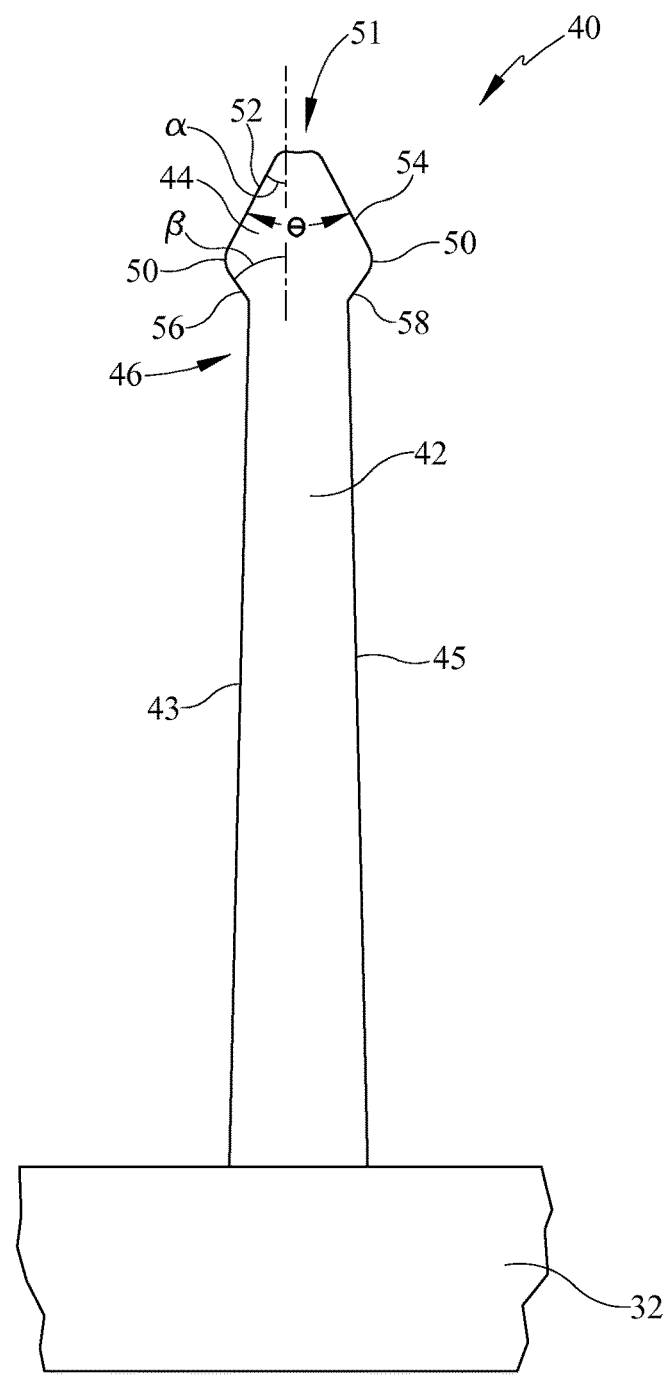
FIG. 4 is a plan view of an exemplary embodiment of a fin utilized with the fin pack cooling assembly.

Referring now to FIG. 4, a detailed view of one fin 40 is shown in an upper view. The surfaces 43, 45 are also shown tapered from a wider dimension at base 32 to a narrower dimension at the distal end 46.

Extending from the end 46 is the head 44. The head 44 includes a retaining edge 50 which retains the cover grasps 64 (FIG. 3). A tip 51 may be cut or formed to flatten the head 44 and provide clearance for positioning of cover 60. It is desirable to limit leakage of air between the heads 44 and the cover 60 in order to maximize flow along the fin surfaces 43, 45.

Figure 5:
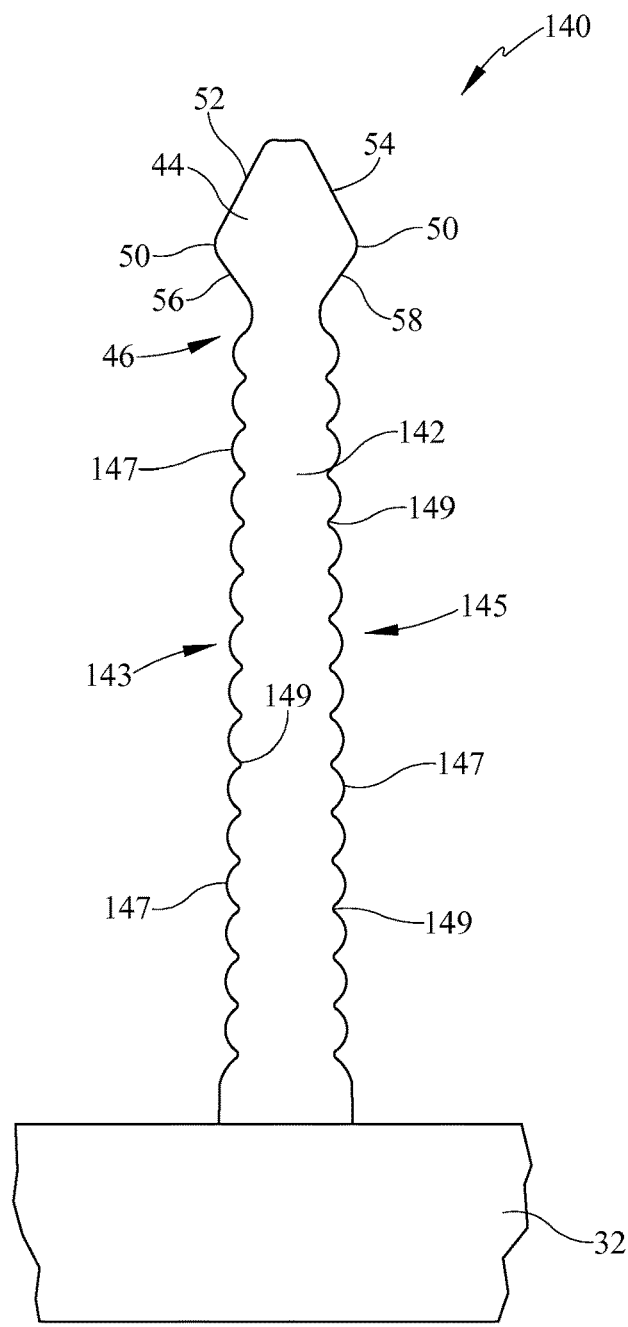
FIG. 5 is a plan view of an alternate embodiment of a fin utilized in the fin pack cooling assembly.

In an alternative view shown in FIG. 5, the wall 142 is shown with a plurality of peaks and valleys along sides 143, 145. The surfaces 143, 145 increase the surface area of the wall 140 for improved cooling. In the depicted embodiment, the peaks and valleys or corrugations may be formed of curvilinear segments 147, 149. The segments 147, 149 may be different lengths and/or radii. As shown in further embodiments, linear segments may alternatively be utilized.

Referring now to both FIGS. 4 and 5, each of the embodiments includes a head 44 having a retaining edge 50. The retaining edge 50 is formed where two surfaces extend and join to form a point at which the grasps 64 may grab the edge 50 to position the cover 60 relative to the fins 40, 140. The head 44 includes surfaces 52, 54 adjacent to the edge 50 which are at an angle α from the fin wall 42, 142 and corresponds to an angle of one of the surfaces of the grasps 64. The head 44 comprises a second surface 54, together with surface 52, which forms a second angle θ. The surfaces 52, 54 are cut to form a flat surface or tip 51 for improved engagement with the cover 60. Additional surfaces 56, 58 extend from fin surfaces 43, 45 and forms retaining edge 50.

The head 44 further comprises surfaces 56, 58 that may extend linearly or may extend curvilinearly from the end 46, providing a recess wherein a portion of grasp 64 may be located. The surfaces 56, 58 extend to surfaces 52, 54 to form the retaining edge 50. The edge 50 may be sharp or may be slightly curved. As the grasps 64 move along surfaces 52, 54, the grasps spread or expand and then pass the edge 50 and slide down surfaces 56, 48. This feature retains the cover 60 in position.

Figure 6:
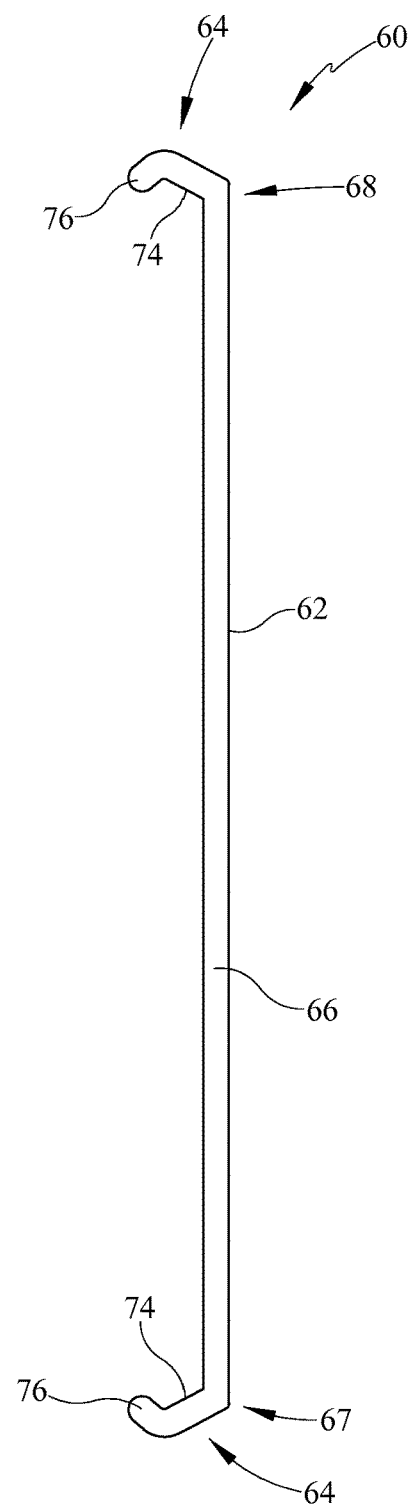
FIG. 6 is an end view of an exemplary cover utilized with the fin pack cooling assembly.

Referring now to FIG. 6, a top view of the cover 60 is shown. The cover 60 includes a planar cover wall 62 and grasps 64 located at lateral edges of the cover wall 62. The cover wall 62 may have a first upper edge 66 and a second lower edge (not shown) as well as third and fourth lateral edges 67, 68. Extending from each of the lateral edges 67, 68 are the grasps 64 which are generally hook-shaped structures which engage the heads 44 of the fins 40. The cover 60 engages each head 44 at ends of the cover 60. Each grasp 64 has an inner surface 74 which substantially corresponds to the angle α of the head surface 52, 54. Accordingly, the surfaces 52, 54 of the head 44 are positioned adjacent to the grasp inner surface 74 and a rib or protrusion 76 defines a location for engagement with the retaining edge 50. The rib 76 extends at an angle corresponding to the angle of surfaces 56, 58. Referring briefly to FIG. 4, the surfaces 52, 54 of the head 44 extending from the retaining edge 50 toward the fin wall 42 may correspond to the angle of the surfaces 76. Additionally, as shown, the ribs 76 of the grasp 64 may be rounded for improved seating between the head 44 and the end of the fin wall 42.

Figure 7:
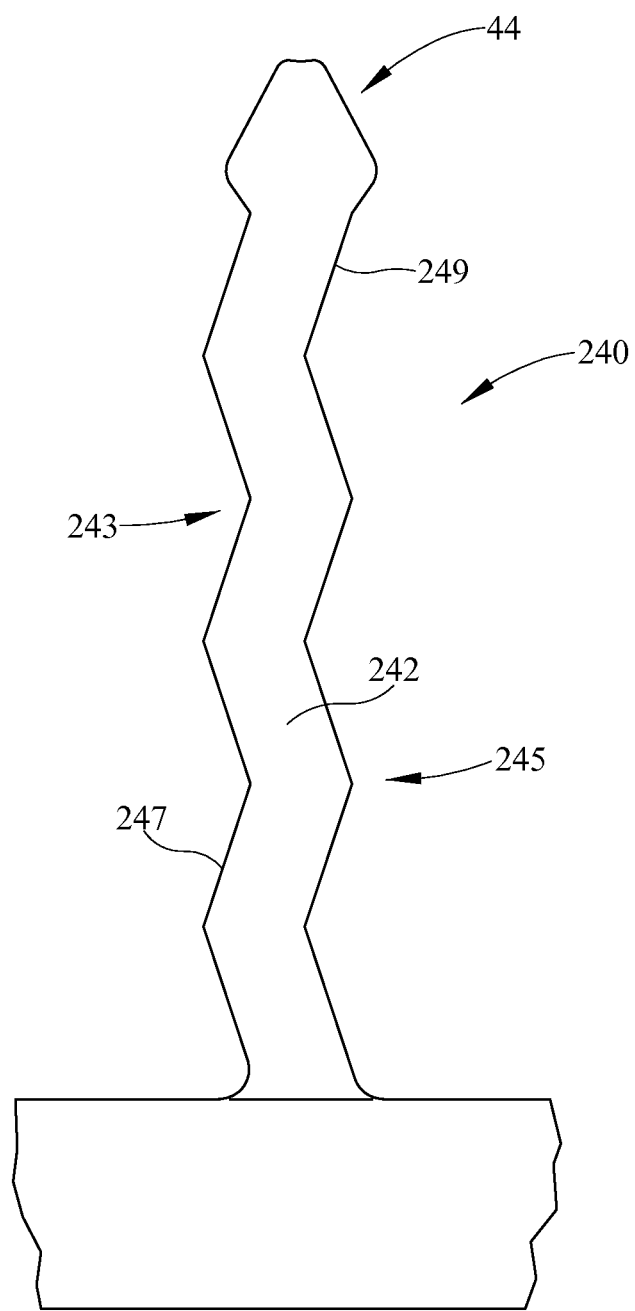
FIG. 7 is a plan view of an alternate exemplary fin utilized in the fin pack cooling assembly; and, FIG. 8 is a plan view of a further alternate exemplary fin utilized in the fin pack cooling assembly.
Figure 8:
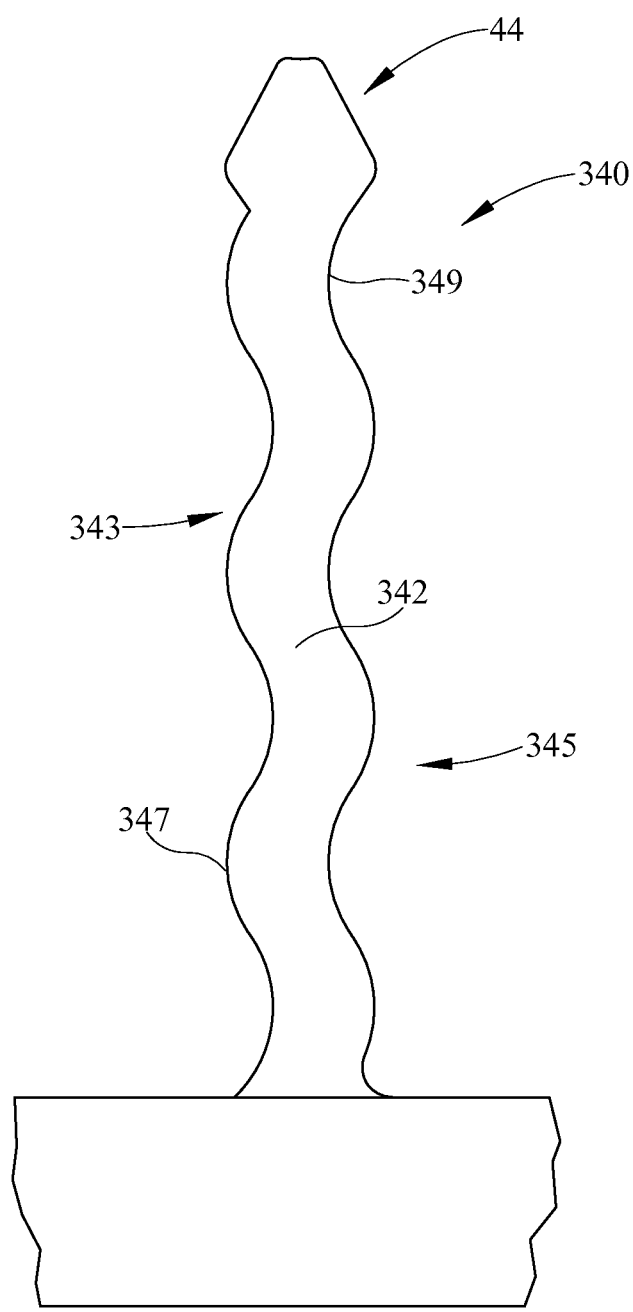

Referring now to FIGS. 7 and 8, two additional embodiments of the fins are shown. In one embodiment, the fin 240 has a fin wall 242 including sides 243, 245. In this embodiment, the sides 243, 245 are formed of linear segments 247, 249.

Alternatively, the embodiment of FIG. 8 may include a plurality of curved segments 347, 349. The fin wall 342 includes sides 343, 345 as with previous embodiments and the curved segments 347, 349 are formed of segments of generally equal radii as opposed to varying radii as in the previous embodiment of FIG. 5.

Additionally, while the term cabinet is used herein and generally with respect to appliances, the term cabinet may also apply to alternate structures which are not necessarily limited to standard appliances. For example, the cabinet may alternatively be defined as a room wherein heat is generated and which is generally sealed for purpose of inhibiting contamination by dust, dirt, or meteorological contaminants such as rain and snow. This may be a breaker room or other electrical plant facility wherein electrical equipment therein may generate heat that needs removal from the generally sealed room. Accordingly, the cabinet, such as a room or building, may have the base of the fin pack directed to the heat source or interior and the fins extending toward the outside of the cabinet which would provide for heat flow or movement from the interior of the cabinet to the exterior. On the exterior of the cabinet, the fin cover may also provide for direction of the flowpaths so that air moves across the fins to remove heat more efficiently.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the invent of embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teaching(s) is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms. The indefinite articles "a" and "an," as used herein in the specification and in the claims, unless clearly indicated to the contrary, should be understood to mean "at least one." The phrase "and/or," as used herein in the specification and in the claims, should be understood to mean "either or both" of the elements so conjoined, i.e., elements that are conjunctively present in some cases and disjunctively present in other cases.

Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

The foregoing description of several methods and an embodiment of the invention has been presented for purposes of illustration. It is not intended to be exhaustive or to limit the invention to the precise steps and/or forms disclosed, and obviously many modifications and variations are possible in light of the above teaching. It is intended that the scope of the invention and all equivalents be defined by the claims appended hereto.

What is claimed is:

1. A cooling structure for an appliance cabinet, comprising:
   an extruded fin pack including:
      a base and a plurality of fins extending from said base, said plurality of fins having a vertical longitudinal direction;
      a head located at an end of each of said plurality of fins opposite said base, each of said heads having at least first and second retaining edges;
   a first cover having a first end, a second end, and third and fourth edges therebetween;
   said first cover having a substantially planar cover wall and a grasp located along each of said third and fourth edges, each of said grasps engaging one of the at least first or second retaining edges of said heads of said plurality of fins to retain said first cover on said extruded fin pack;
   said grasps having a dimension which is half or less than half of a spacing between adjacent fins of said plurality of fins.

2. The cooling structure of claim 1, said plurality of fins each having a plurality of segments.

3. The cooling structure of claim 2, said first cover creating a plurality of flowpaths between said base, said plurality of fins, and said cover.

4. The cooling structure of claim 1, said first cover hiding said plurality of fins from view within said appliance cabinet.

5. The cooling structure of claim 1, said plurality of fins arranged to create vertical flowpaths within said appliance cabinet.

6. The cooling structure of claim 1, said third and fourth edges extending substantially vertically.

7. The cooling structure of claim 1, said grasps extending from said substantially planar cover wall.

8. The cooling structure of claim 1, said first cover being open along said first end and said second end to allow air flow through said plurality of fins.

9. The cooling structure of claim 8, said first cover restraining the air flow to be through said plurality of fins and between said base and said first cover.

10. The cooling structure of claim 1, further comprising a second cover connected to said extruded fin pack adjacent to said first cover.

11. The cooling structure of claim 1, wherein said base is in thermal communication with an evaporator of the appliance cabinet.

12. The cooling structure of claim 1, said first cover having a width that is less than a width of said base.

13. A cooling assembly for an appliance, comprising:
   a cabinet having at least one opening for storage of fresh or frozen food products;
   an extruded fin pack in thermal communication with a heat exchanger used to remove heat from said cabinet;
   said extruded fin pack including a base and a plurality of fins extending from said base, said plurality of fins each having a longitudinal axis which extends in a vertical direction, said plurality of fins defining a plurality of planar flowpaths extending substantially vertically within said cabinet;
   a head located at an end of each of said plurality of fins opposite said base, each of said heads having at least one retaining edge;
   a cover having a planar surface and at least one grasp along opposed edges of said cover, said cover being free of openings;
   said cover disposed on said plurality of fins opposite said base;

said at least one grasp engaging one of said at least one retaining edges to retain said cover in a vertical plane;

said cooling assembly creating a flow through said plurality of planar flowpaths and under said cover for improved cooling of said cabinet.

14. The cooling assembly of claim 13, said at least one grasp being sized so that two adjacent grasps may be positioned between adjacent fins of the plurality of fins.

15. The cooling assembly of claim 13, said cover including a sidewall, said at least one grasp located at an edge of said sidewall.

16. The cooling assembly of claim 15, upper and lower ends of said cover being open for flow of cooling air between said plurality of fins.

* * * * *